United States Patent
Lee et al.

(10) Patent No.: US 10,205,258 B1
(45) Date of Patent: Feb. 12, 2019

(54) INDUSTRIAL INPUT AND OUTPUT DEVICE WITH SERIES CONNECTORS

(71) Applicant: MOXA INC., New Taipei (TW)

(72) Inventors: Guan-Liang Lee, New Taipei (TW); Yi-Chun Huang, New Taipei (TW)

(73) Assignee: MOXA INC., New Taipei (TW)

( * ) Notice: Subject to any disclaimer, the term of this patent is extended or adjusted under 35 U.S.C. 154(b) by 0 days.

(21) Appl. No.: 15/793,942

(22) Filed: Oct. 25, 2017

(51) Int. Cl.
| | | |
|---|---|---|
| *H01R 9/24* | (2006.01) | |
| *H05K 1/14* | (2006.01) | |
| *G06F 13/10* | (2006.01) | |
| *H01R 12/70* | (2011.01) | |
| *H01R 12/71* | (2011.01) | |
| *H01R 12/73* | (2011.01) | |
| *H01R 13/08* | (2006.01) | |
| *H01R 13/514* | (2006.01) | |
| *H01R 13/703* | (2006.01) | |

(52) U.S. Cl.
CPC ......... *H01R 12/718* (2013.01); *G06F 13/107* (2013.01); *H01R 9/2408* (2013.01); *H01R 12/7011* (2013.01); *H01R 12/73* (2013.01); *H01R 13/08* (2013.01); *H01R 13/514* (2013.01); *H01R 13/7036* (2013.01); *H05K 1/142* (2013.01)

(58) Field of Classification Search
CPC .. H01R 9/2408; H01R 13/514; H01R 23/725; H01R 9/096; H01R 12/718; H01R 12/73; H01R 12/7011; H01R 13/7036; H01R 13/08; H05K 1/142; G06F 13/107
USPC ..................................... 439/717, 74, 75, 660
See application file for complete search history.

(56) References Cited

U.S. PATENT DOCUMENTS

| | | | | |
|---|---|---|---|---|
| 4,322,120 A | * | 3/1982 | Rilling ................. | H01R 12/716 439/631 |
| 4,514,784 A | * | 4/1985 | Williams ............... | H01R 12/52 361/716 |
| 5,176,526 A | * | 1/1993 | Hillbish ................. | H01R 23/68 439/108 |
| 5,575,686 A | * | 11/1996 | Noschese ............... | H01R 23/68 327/262 |
| 5,676,553 A | * | 10/1997 | Leung .................. | H01R 31/005 439/74 |
| 5,716,241 A | * | 2/1998 | Hennemann ............ | G06F 1/184 439/716 |
| 5,885,109 A | * | 3/1999 | Lee ....................... | H01R 13/514 439/131 |
| 6,416,333 B1 | * | 7/2002 | Hasegawa ............. | G06F 13/409 361/785 |

(Continued)

*Primary Examiner* — Gary F Paumen
(74) *Attorney, Agent, or Firm* — Chih Feng Yeh; Huntington IP Consulting Co., Ltd.

(57) ABSTRACT

The disclosure illustrates an industrial input/output device with series connectors. The industrial input/output device includes a circuit board, a male connector and a female connector respectively electrically connected to both sides of the circuit board, and pin guides configured to guide electrical connection pins of the male connector of another industrial input/output device to slide, so that the male connector of the another industrial input/output device can be electrically connected to the female connector of the industrial input/output device, and the technical effect of providing electrical connection timing control for series connection between the male connector and the female connector can be achieved.

16 Claims, 25 Drawing Sheets

(56) References Cited

U.S. PATENT DOCUMENTS

| | | | |
|---|---|---|---|
| 6,461,178 B1* | 10/2002 | Fu | H01R 31/06 |
| | | | 439/224 |
| 6,561,853 B1* | 5/2003 | Yu | H01R 35/04 |
| | | | 439/31 |
| 7,789,714 B2* | 9/2010 | Liu | H01R 12/716 |
| | | | 439/682 |
| 2001/0031568 A1* | 10/2001 | Brekosky | H05K 7/142 |
| | | | 439/74 |
| 2001/0034163 A1* | 10/2001 | Chiang | H01R 13/26 |
| | | | 439/660 |
| 2011/0039441 A1* | 2/2011 | Zhu | H01R 12/57 |
| | | | 439/374 |
| 2012/0135642 A1* | 5/2012 | Chang | H01R 9/032 |
| | | | 439/630 |
| 2013/0052880 A1* | 2/2013 | Wu | H01R 12/58 |
| | | | 439/660 |
| 2013/0344729 A1* | 12/2013 | Hung | H01R 13/112 |
| | | | 439/374 |
| 2014/0350701 A1* | 11/2014 | Underwood | H01R 9/2408 |
| | | | 700/83 |
| 2015/0154136 A1* | 6/2015 | Markovic | G06F 13/4022 |
| | | | 710/317 |

* cited by examiner

INDUSTRIAL INPUT AND OUTPUT DEVICE WITH SERIES CONNECTORS

BACKGROUND

1. Technical Field

The present disclosure illustrates an industrial input/output device, more particularly to an industrial input/output device with series connectors to connect another industrial input/output device in series.

2. Description of Related Art

Generally, there are two assembly methods for assembling industrial input/output devices, one assembly method is to provide a back plate and the industrial input/output devices are plugged on the back plate for assembly and further control; other assembly method is to dispose a series interface on the industrial input/output device, so that the industrial input/output devices can be connected in series with each other through the series interfaces, without using the back plate, thereby assembling the industrial input/output devices for further control.

U.S. Patent Application Pub. No. US20150154136A1 discloses an input/output module with multi-channel switching capability. According to the content of U.S. Patent Application Pub. No. US20150154136A1, the input/output modules can be connected on a back plate for assembly and further control of the industrial input/output devices.

U.S. Pat. No. 5,716,241A discloses an input/output device for a data bus. According to content of the U.S. Pat. No. 5,716,241A, the input/output device includes a plurality of electrical connection contacts disposed on two sides thereof, so that the industrial input/output devices can be connected with each other in series through the electrical connection contacts, for assembly and further control.

However, the assembly method using the back plate may have a problem of occupying more space; and the assembly method using series interface may reduce the occupied space, but it may have a problem of lacking electrical connection timing control, and this problem may cause data or signal transmission error, and even damage of the industrial input/output device.

Therefore, what is need is to develop an industrial input/output device which can solve the problem of lacking electrical connection timing control when the industrial input/output devices are connected in series without using the back plate.

SUMMARY

In order to solve the conventional problem of lacking electrical connection timing control for series connection between industrial input/output devices, the present disclosure is to provide an industrial input/output device with series connectors.

According to an embodiment, industrial input/output device of the present disclosure comprises a shell member, a circuit board, at least one female connector and at least one male connector. The industrial input/output device is in series with another industrial input/output device. The circuit board is disposed in the shell member. The at least one female connector is electrically connected to a first surface of the circuit board and exposed out of a first side surface of the shell member, and includes a plurality of electrical connection pinholes. The at least one male connector is electrically connected to a second surface of the circuit board and disposed corresponding in position to the female connector, and exposed out of a second side surface of the shell member, and includes a plurality of electrical connection pins. The shell member includes pin guides formed on the first side surface and corresponding in position to the electrical connection pinholes of the female connector respectively, and is configured to guide electrical connection pins of the male connector of the another industrial input/output device to respectively slide therealong, thereby electrically connecting the male connector of another industrial input/output device with the female connector of the industrial input/output device. The female connector of the industrial input/output device is in electrical connection with the male connector of the industrial input/output device through the circuit board.

According to above content, the difference between the present disclosure and the conventional technology is that the industrial input/output device of the present disclosure includes the circuit board, the pin guides, and the male connector and the female connector electrically connected to two sides of the circuit board respectively, so that the electrical connection pins of the male connector of another industrial input/output device can be guided to slide along the pin guides, to electrically connect to the female connector of the industrial input/output device.

By using above-mentioned technology, the conventional technology problem that it lacks the electrical connection timing control when the industrial input/output devices are being connected in series, and the industrial input/output device of the present disclosure can provide the electrical connection timing control while the male connector and the female connector are being electrically connected.

BRIEF DESCRIPTION OF THE DRAWINGS

The structure, operating principle and effects of the present disclosure will be described in detail by way of various embodiments which are illustrated in the accompanying drawings.

DETAILED DESCRIPTION

Figure 1A:
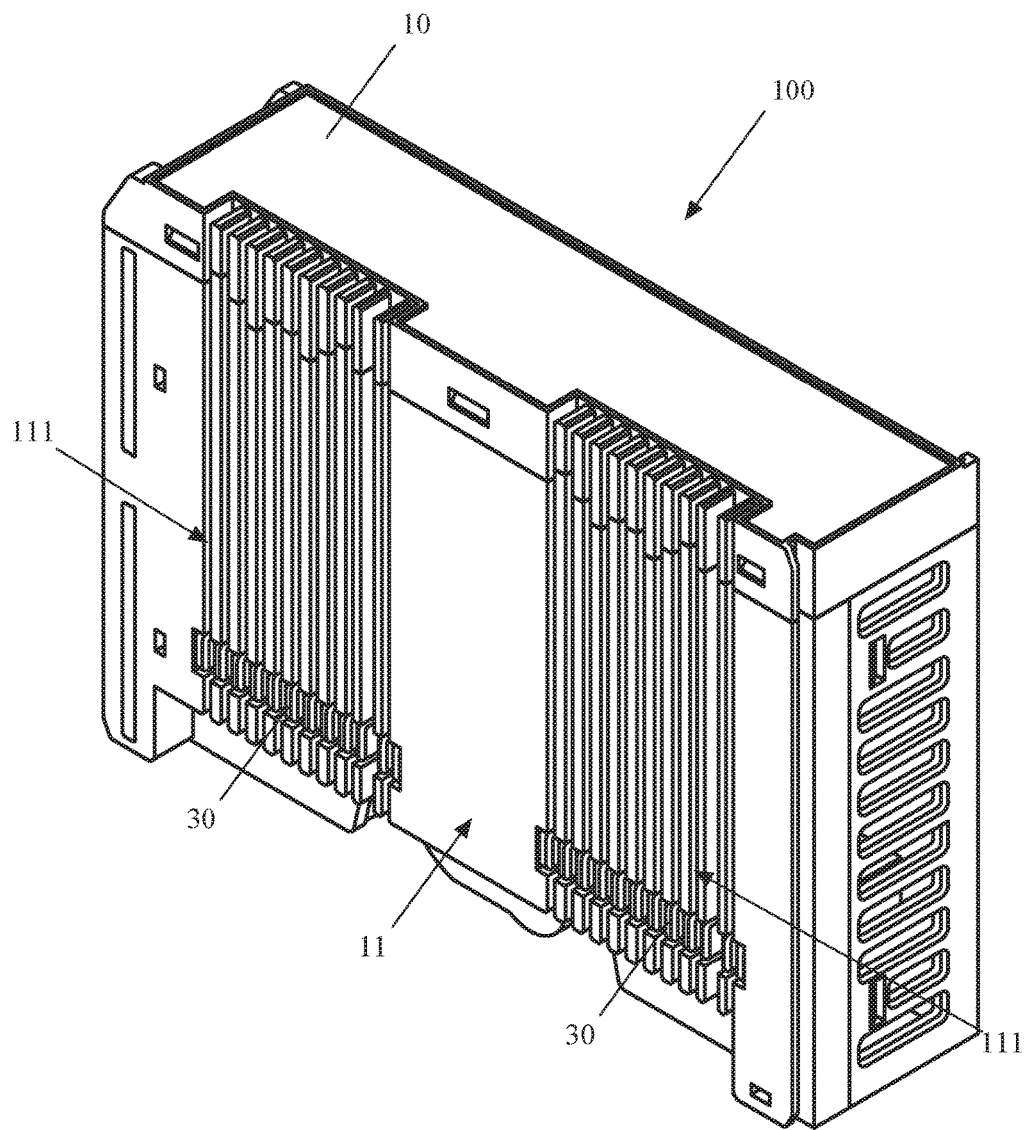
FIG. 1A is a perspective view of an industrial input/output device with series connectors in accordance with the present disclosure, when viewed from a first angle.
Figure 1B:
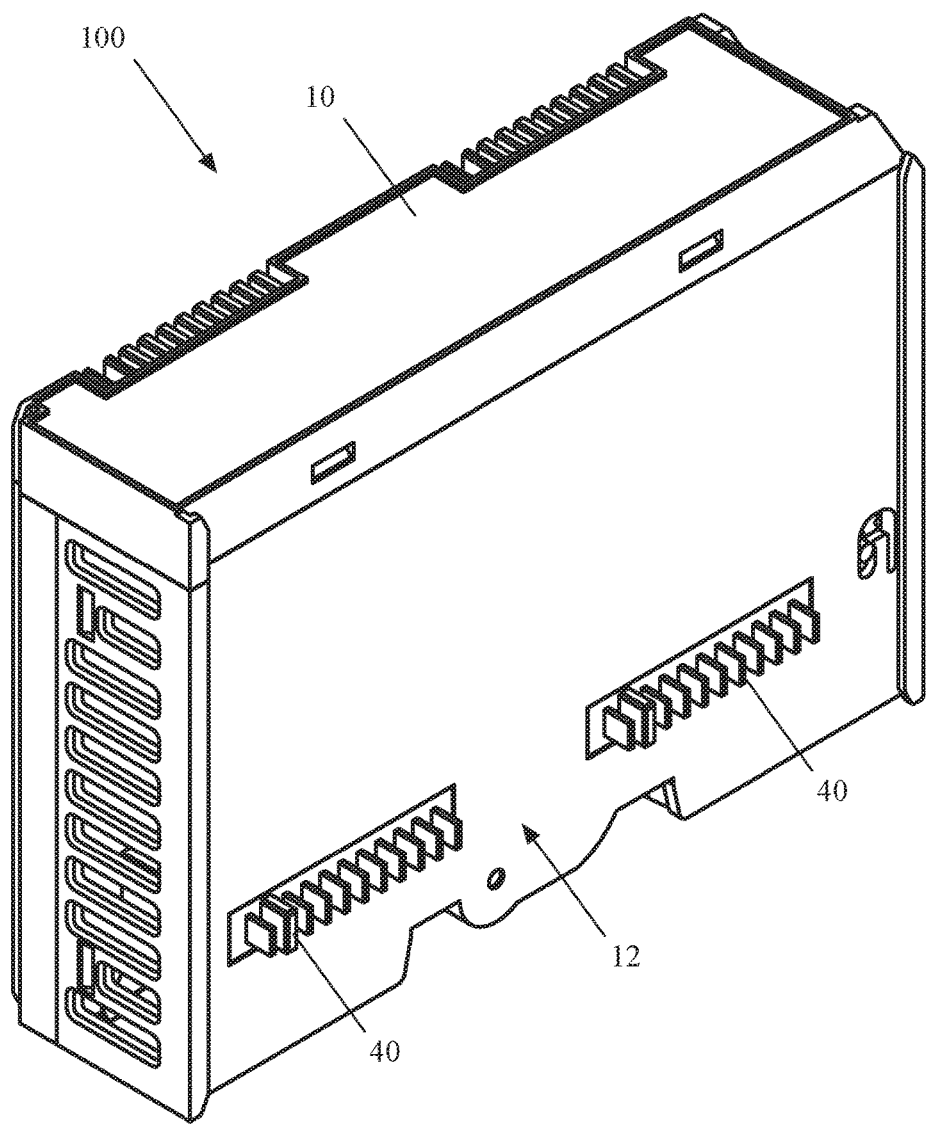
FIG. 1B is a perspective view of the industrial input/output device with series connectors in accordance with the present disclosure, when viewed from a second angle.
Figure 2A:
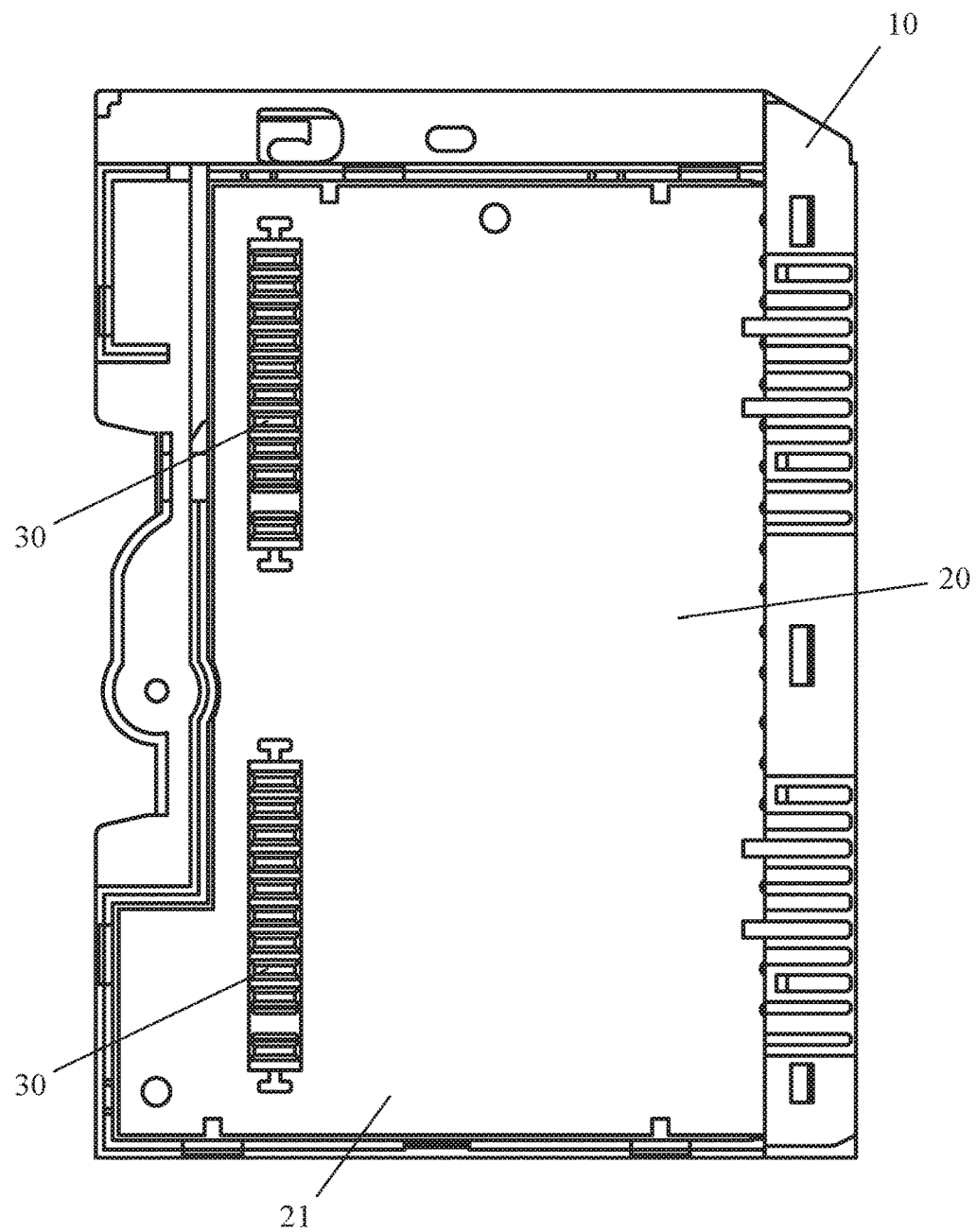
FIG. 2A is a plan view of the interior of a shell member of the industrial input/output device with series connectors in accordance with the present disclosure, when viewed from a first angle.
Figure 2B:
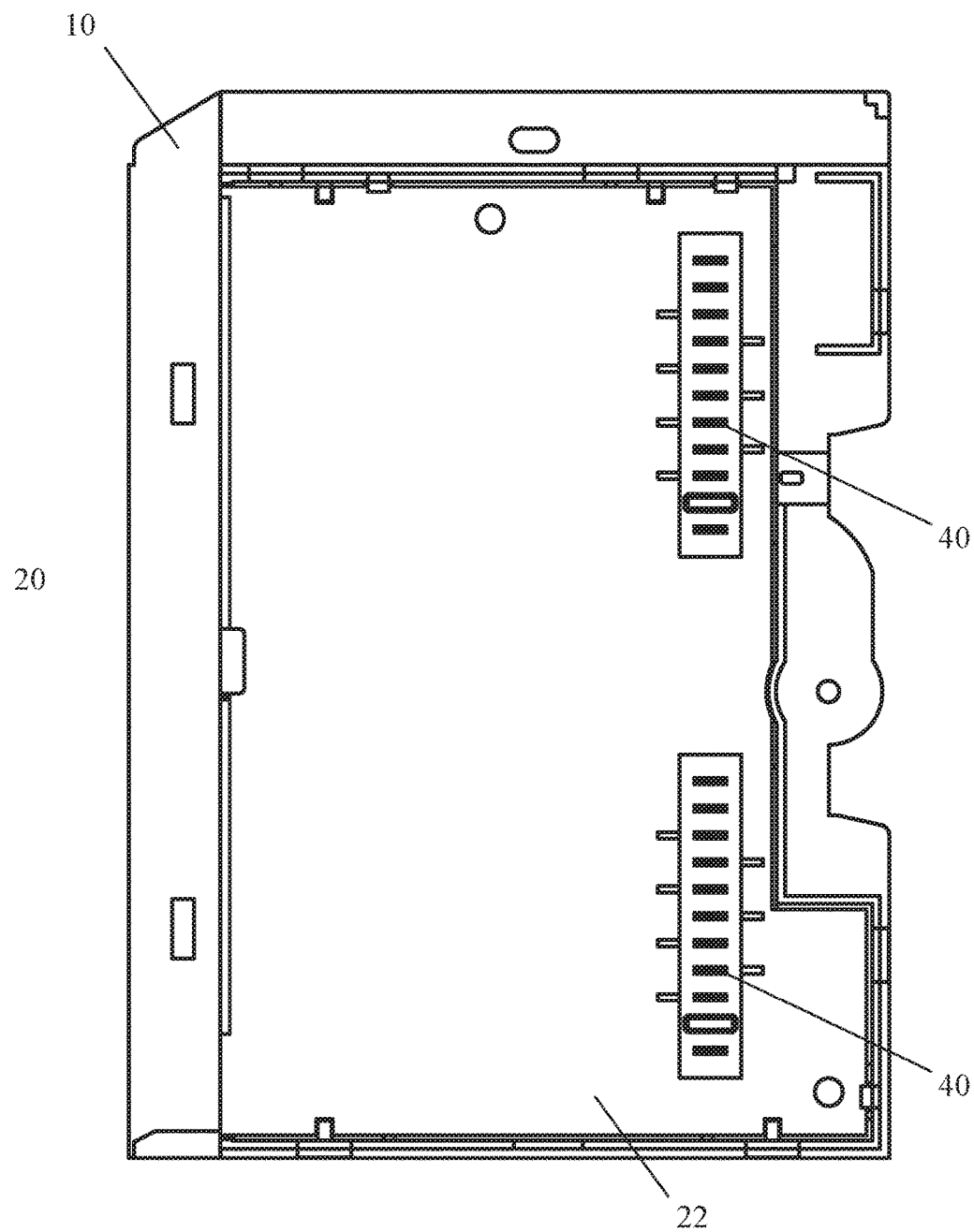
FIG. 2B is a plan view of the interior of the shell member of the industrial input/output device with series connectors in accordance with the present disclosure, when viewed from a second angle.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Please refer to FIGS. 1A, 1B, 2A and 2B, which are perspective view of the industrial input/output device with series connectors in accordance with the present disclosure, when viewed from first and second angles respectively, and plan views of the interior of a shell member of the industrial input/output device with series connectors in accordance with the present disclosure, when viewed from first and second angles, respectively.

The industrial input/output device 100 includes a shell member 10, a circuit board 20, a female connector 30 and a male connector 40.

The circuit board 20 is disposed inside the shell member 10, and the female connector 30 is electrically connected to a first surface 21 of the circuit board 20, and the male connector 40 is electrically connected to a second surface 22 of the circuit board 20, wherein the female connector 30 and the male connector 40 may be surface-mount devices to reduce the occupied space, but this example is merely for schematic illustration and the application field of the present disclosure is not limited thereto. The first surface 21 of the circuit board 20 is opposite to the second surface 22 of the circuit board 20. The female connector 30 disposed on the first surface 21 of the circuit board 20 and the male connector 40 disposed on the second surface 22 of the circuit board 20 correspond to each other in position.

The circuit board 20 of the present disclosure is a multi-layer PCB in which circuit layouts are formed, so that the circuit board 20 with small area is sufficient to implement the function of the industrial input/output device 100 of the present disclosure; in other words, the industrial input/output device 100 can have a smaller size to facilitate miniaturization.

The female connector 30 is exposed out of a first side surface 11 of the shell member 10 through a female connector hole on the first side surface 11, and the male connector 40 is exposed out of a second side surface 12 of the shell member 10 through a male connector hole on the second side surface 12. The female connector 30 and the male connector 40 are electrically connected to each other through the circuit board 20, and the female connector hole formed on the first side surface 11 of the shell member 10 corresponds in position to the male connector hole formed on the second side surface 12 of the shell member 10.

It should be noted that the electrical connection pinholes 31 of the female connector 30 correspond to and are electrically connected to electrical connection pins 41 of the male connector 40 in a one-to-one relationship through circuits formed in the circuit board 20; in other words, the first electrical connection pinhole of the female connector 30 is in electrical connection with the first electrical connection pin of the male connector 40, the second electrical connection pinhole of the female connector 30 is in electrical connection with the second electrical connection pin of the male connector 40, the third electrical connection pinhole of the female connector 30 is in electrical connection with the third electrical connection pin of the male connector 40, and the Nth electrical connection pinhole of the female connector 30 is in electrical connection with the Nth electrical connection pin of the male connector 40, and so forth.

In an embodiment, a part of the electrical connection pinholes 31 of the female connector 30 can be in electrical connection with a part of the electrical connection pins 41 of the male connector 40 respectively through circuits of the circuit board 20, for example, the first electrical connection pinhole of the female connector 30 can be in electrical connection with the second electrical connection pin of the male connector 40, the second electrical connection pinhole of the female connector 30 can be in electrical connection with the fifth electrical connection pin of the male connector 40, and the fourth and fifth electrical connection pinholes of the female connector 30 can be in electrical connection with the first electrical connection pin of the male connector 40, and the seventh electrical connection pinhole of the female connector 30 can be in electrical connection with the seventh and eighth electrical connection pin of the male connector 40. However, these examples are merely for exemplary illustration, and the present disclosure is not limited thereto. The configuration of electrical connection between the pinholes of the female connector 30 and the pins of the male connector 40 through the circuit board 20 can be designed upon practice demand.

In figures of the present disclosure, two female connectors 30, two male connectors 40, two female connector holes and two male connector holes are shown as examples for schematic illustration, but in actual application, the industrial input/output device can include a female connector 30, a male connector 40, a female connector hole and a male connector hole; or, the industrial input/output device can include a plurality of female connectors 30, a plurality of male connectors 40, a plurality of female connector holes and a plurality of male connector holes.

Figure 3A:
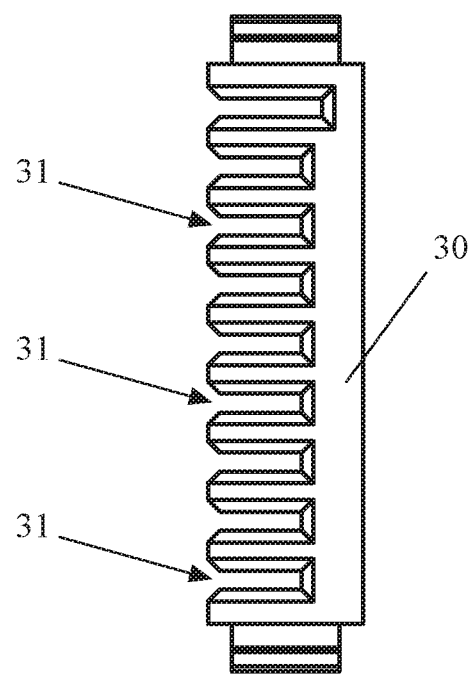
FIG. 3A is a plan view of a first embodiment of a female connector of the industrial input/output device with series connectors in accordance with the present disclosure.
Figure 3B:
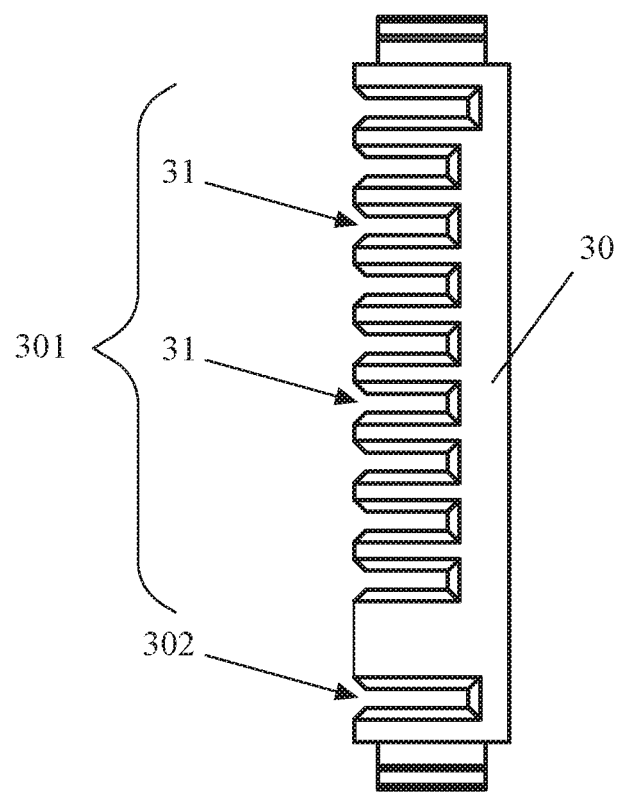
FIG. 3B is a plan view of a second embodiment of a female connector of the industrial input/output device with series connectors in accordance with the present disclosure.
Figure 3C:
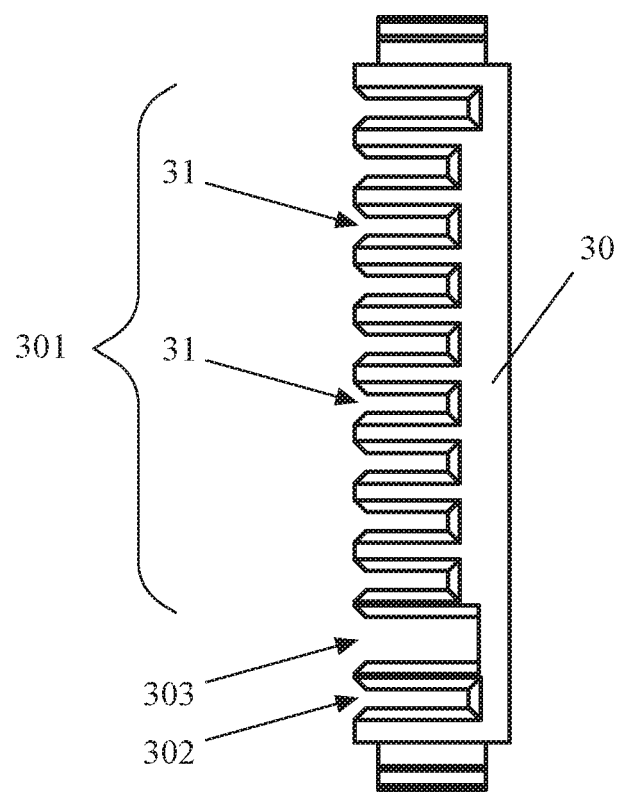
FIG. 3C is a plan view of a third embodiment of a female connector of the industrial input/output device with series connectors in accordance with the present disclosure.

Please refer to FIGS. 3A, 3B and 3C, which show plan views of first, second, and third embodiments of the female connector of the industrial input/output device with series connectors in accordance with the present disclosure, respectively.

In the first embodiment, the female connector 30 includes a plurality of electrical connection pinholes 31 which are uniformly distributed in the female connector 30.

In the second embodiment, the female connector 30 includes multiple electrical connection pinholes 31 which are separately distributed in a first pinhole area 301 and a second pinhole area 302, and the electrical connection pinholes 31 disposed in each of the first pinhole area 301 and the second pinhole area 302 are uniformly distributed.

In the third embodiment, the female connector 30 includes multiple electrical connection pinholes 31 which are separately distributed in the first pinhole area 301 and the second pinhole area 302, and the electrical connection pinholes 31 disposed in each of the first pinhole area 301 and the second pinhole area 302 are uniformly distributed, and an anti-misplug structure 303 is formed between the first pinhole area 301 and the second pinhole area 302 to prevent accidental conduction between pinholes and pins when the male connector of the industrial input/output device is being electrically connected to the female connector of another input/output device, so as to prevent signal transmission error between the two industrial input/output devices or prevent the two industrial input/output devices from being damaged. It should be noted that the anti-misplug structure 303 shown in the FIG. 3C is merely for schematic illustration, but the application field of the present disclosure is not limited thereto.

Figure 4A:
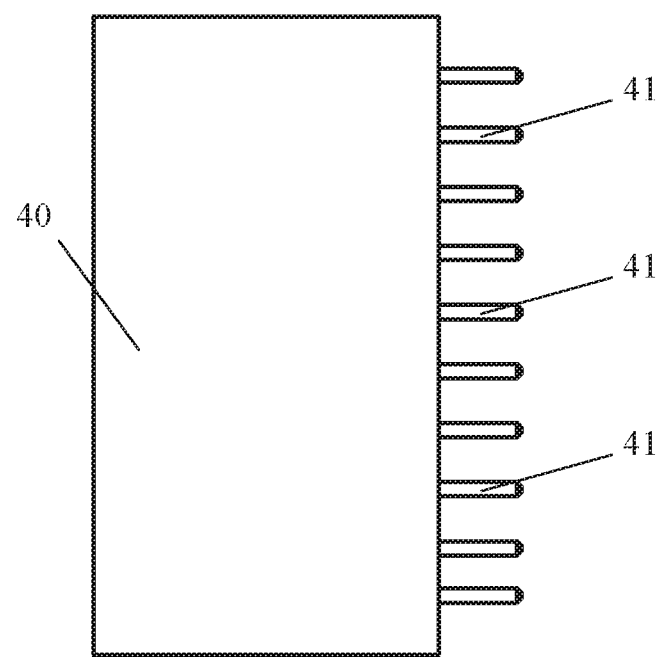
FIG. 4A is a plan view of a first embodiment of a male connector of the industrial input/output device with series connectors in accordance with the present disclosure.
Figure 4B:
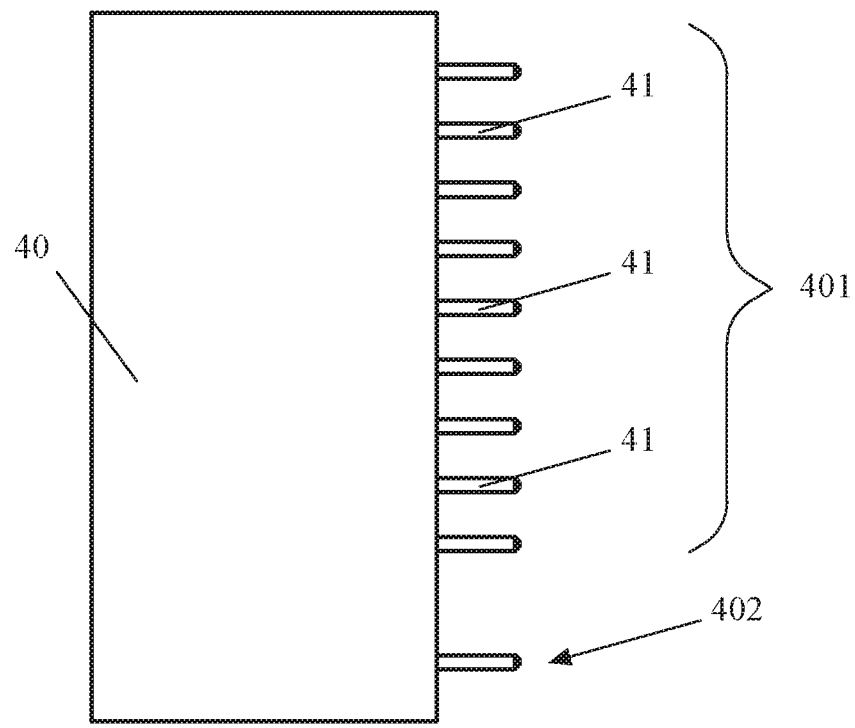
FIG. 4B is a plan view of a second embodiment of a male connector of the industrial input/output device with series connectors in accordance with the present disclosure.
Figure 4C:
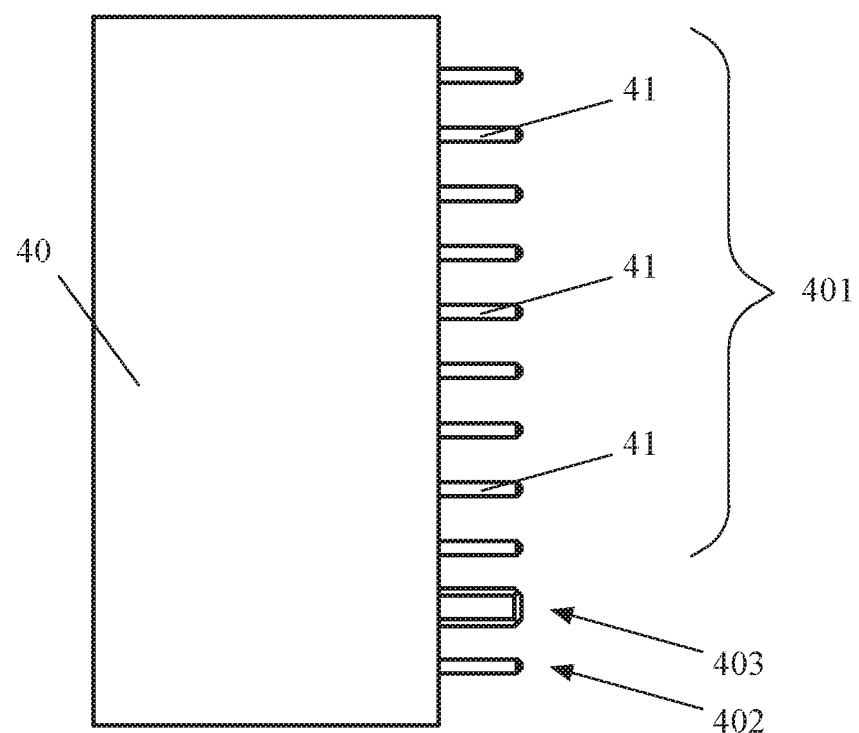
FIG. 4C is a plan view of a third embodiment of a male connector of the industrial input/output device with series connectors in accordance with the present disclosure.

Please refer to FIGS. 4A, 4B and 4C, which show plan views of first, second, and third embodiments of the male connector of the industrial input/output device with series connectors in accordance with the present disclosure, respectively.

In the first embodiment, the male connector 40 includes a plurality of electrical connection pins 41 uniformly distributed therein.

In a second embodiment, the male connector 40 includes a plurality of electrical connection pins 41 separately disposed in a first pin area 401 and a second pin area 402, and the electrical connection pins 41 disposed in each of the first pin area 401 and the second pin area 402 are uniformly distributed.

In the third embodiment, the male connector 40 includes a plurality of electrical connection pins 41 separately disposed in the first pin area 401 and the second pin area 402 of the male connector 40, and the electrical connection pins 41 disposed in each of the first pin area 401 and the second pin area 402 are uniformly distributed, and an anti-misplug structure 403 is formed between the first pin area 401 and the second pin area 402 and configured to prevent accidental conduction between the pins when the male connector of the industrial input/output device is electrically connected to the female connector of another industrial input/output device, so as to prevent signal transmission error between the two industrial input/output devices and prevent the two industrial input/output devices from being damaged. It should be noted that the anti-misplug structure 403 shown in the FIG. 4C is merely for schematic illustration, but the application field of the present disclosure is not limited thereto.

It should be noted that the electrical connection pinholes 31 distributed in the first pinhole area 301 of the female connector 30 respectively correspond in position to the electrical connection pins 41 distributed in the first pin area 401 of the male connector 40, and the electrical connection pinholes 31 distributed in the second pinhole area 302 of the female connector 30 respectively correspond in position to the electrical connection pins 41 distributed in the second pin area 402 of the male connector 40, so that the male connector of another industrial input/output device can be electrically connected to the female connector of the industrial input/output device.

Figure 5A:
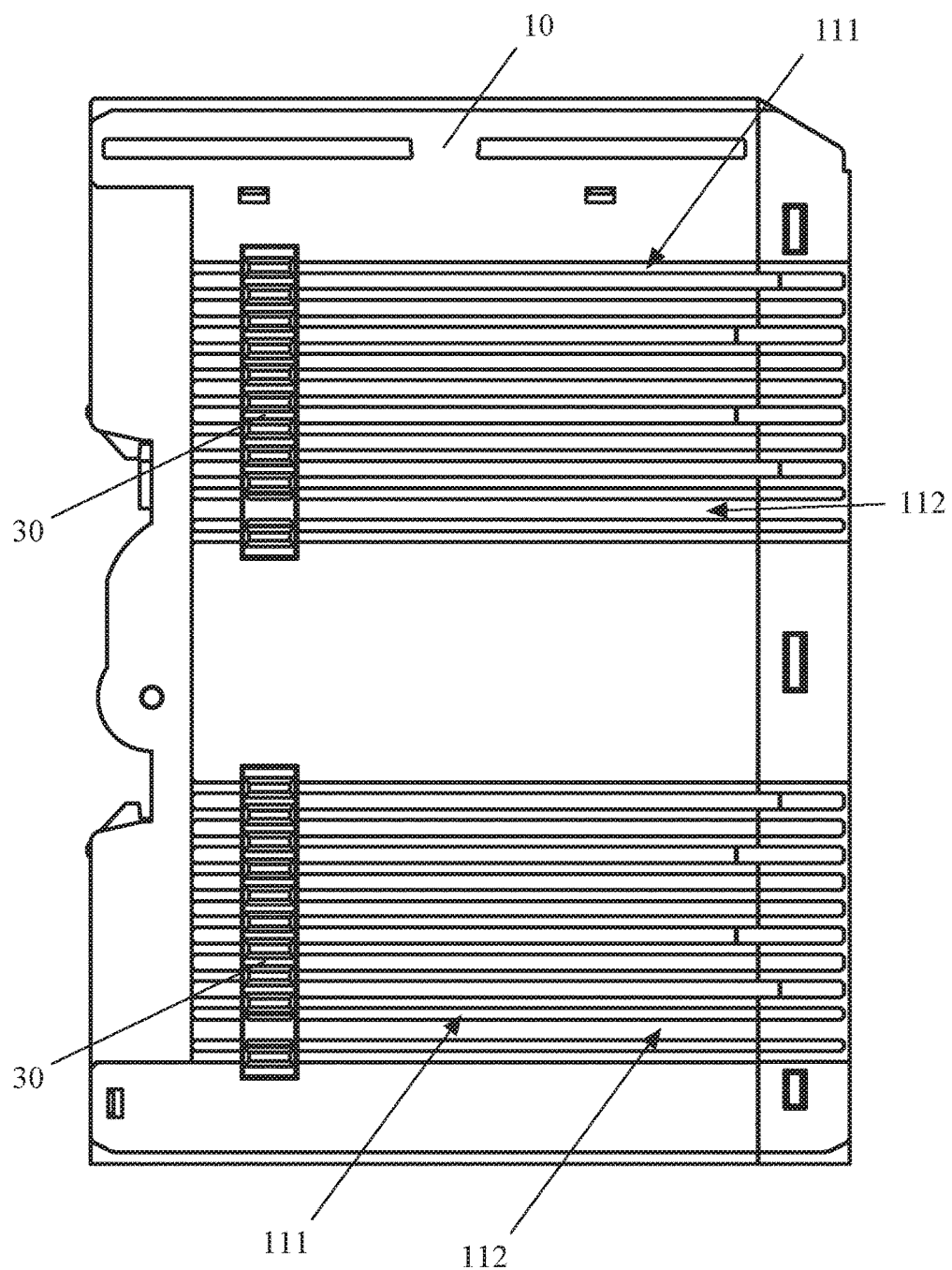
FIG. 5A is a plan view of a first embodiment of the industrial input/output device with series connectors in accordance with the present disclosure, when viewed from a first angle.
Figure 5B:
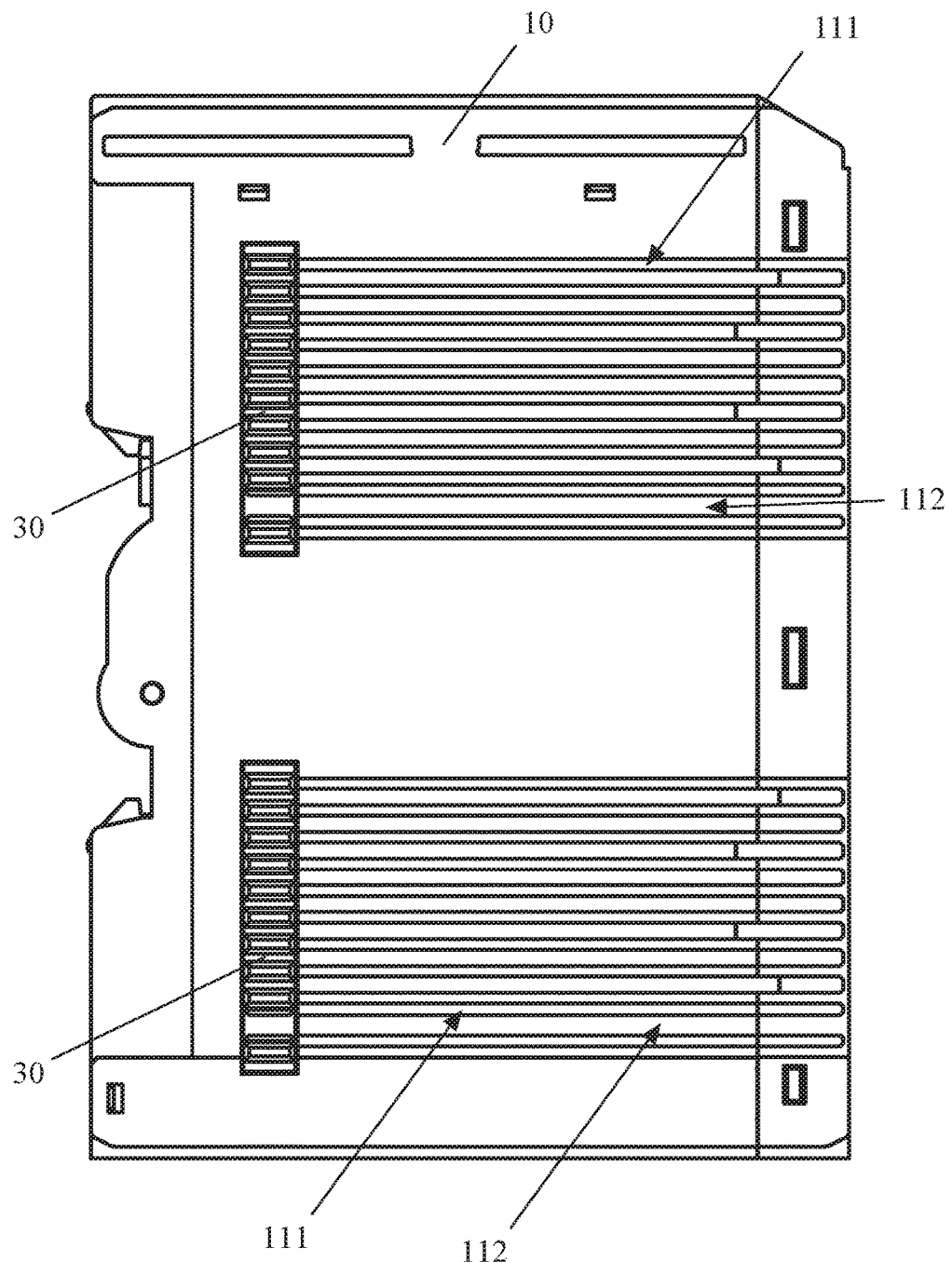
FIG. 5B is a plan view of a second embodiment of the industrial input/output device with series connectors in accordance with the present disclosure, when viewed from a first angle.
Figure 5C:
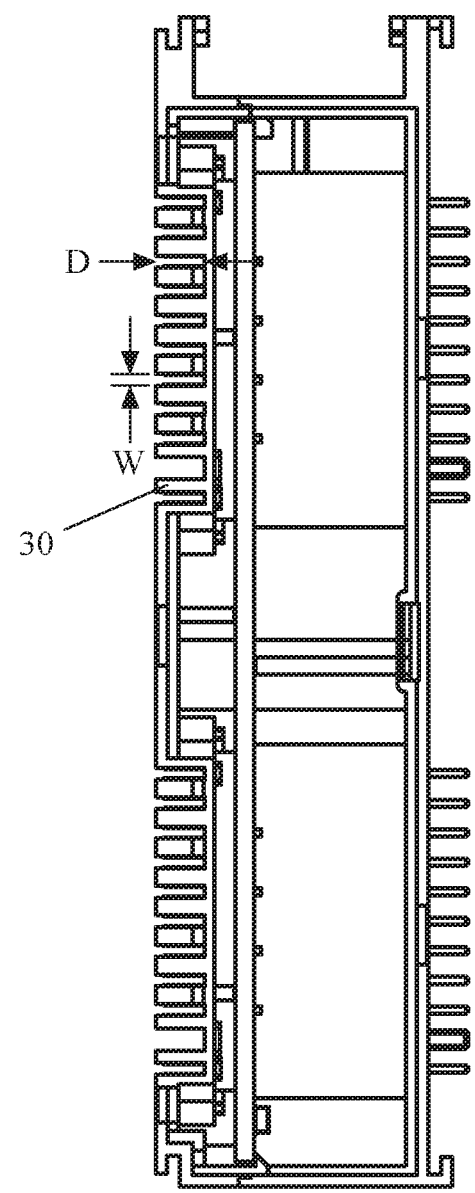
FIG. 5C is a plan view of the industrial input/output device with series connectors in accordance with the present disclosure, when viewed from a second angle.

Please refer to FIGS. 1A, 5A, 5B and 5C. FIG. 5A shows a plan view of first embodiment of the industrial input/output device of the present disclosure when viewed from a first angle; FIG. 5B shows a plan view of a second embodiment of the industrial input/output device of the present disclosure when viewed from a first angle; FIG. 5C shows a plan view of the industrial input/output device of the present disclosure when viewed from a second angle.

The shell member 10 includes pin guides 111 formed on the first side surface 11 correspondingly in position to the electrical connection pinholes 31 of the female connector 30 respectively. The electrical connection pins of the male connector of another industrial input/output device can be slid along the pin guides 111 to electrically connect to the female connector of the industrial input/output device.

In FIG. 5A, the shell member 10 includes pin guides 111 formed on the first side surface 11 correspondingly in position to the electrical connection pinholes 31 of the female connector 30, and each pin guide 111 is formed on the first side surface 11 of the shell member 10 across; in addition, the shell member 10 also includes anti-misplug structure guides 112 formed on the first side surface 11 of the shell member 10 and corresponding in position to the anti-misplug structure 303 of the female connector 30. Each anti-misplug structure guide 112 is formed on the first side surface 11 of the shell member 10 across.

In FIG. 5B, the shell member 10 includes pin guides 111 formed on the first side surface 11 thereof correspondingly in position to the electrical connection pinholes 31 of the female connector 30 respectively, and each pin guide 111 is formed between an edge of the shell member 10 and the position of the electrical connection pinhole 31 of the female connector 30; in addition, the shell member 10 also includes an anti-misplug structure guide 112 formed on the first side surface 11 correspondingly in position to the anti-misplug structure 303 of the female connector 30, and also formed only between the edge of the shell member 10 and the position of the electrical connection pinhole 31 of the female connector 30. By the disposal of the pin guides 111 and the anti-misplug structure guide 112 only between the edge of the shell member 10 and the position of the electrical connection pinholes 31 of the female connector 30, the male connector of the another industrial input/output device can be effectively located and electrically connected to the female connector of the industrial input/output device.

It should be noted that, the pin guide 11 has a size matched with a size of the electrical connection pinhole 31; the pin guide 11 has the size including a depth D and a width W, and the electrical connection pinhole 31 has the size including the depth D and the width W. The size of the anti-misplug structure guide 112 is matched with the size of the anti-misplug structure 303, the anti-misplug structure guide 112 has the size including the depth D and the width W, and the anti-misplug structure 303 has the size including the depth D and the width W.

Figure 6A:
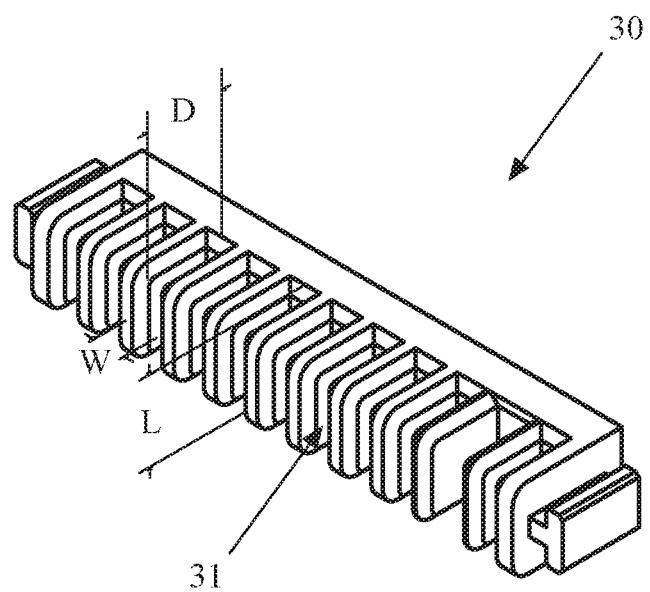
FIG. 6A is a perspective view of a first embodiment of the female connector of the industrial input/output device with series connectors in accordance with the present disclosure.
Figure 6B:
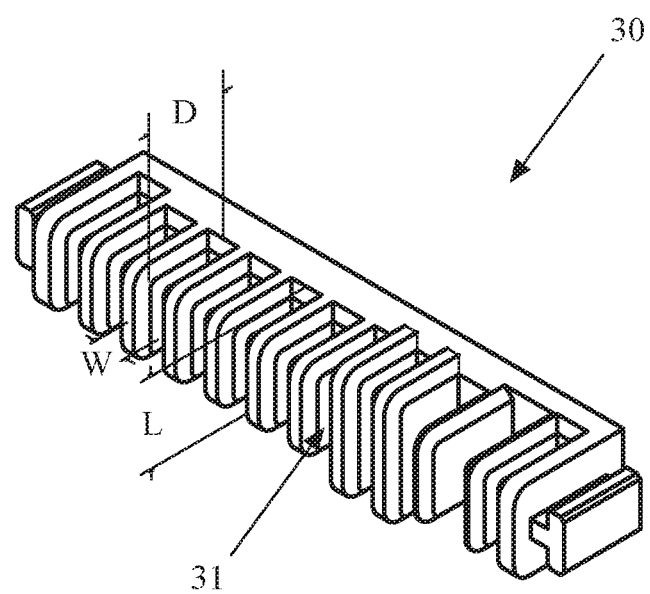
FIG. 6B is a perspective view of a second embodiment of the female connector of the industrial input/output device with series connectors in accordance with the present disclosure.

Please refer to FIGS. 6A and 6B, which are perspective views of first and second embodiments of the female connector of the industrial input/output device with series connectors in accordance with the present disclosure, respectively.

As shown in FIG. 6A, each electrical connection pinhole 31 of the female connector 30 has the same size including a length L, the width W and the depth D.

As shown in FIG. 6B, there is at least one of electrical connection pinholes 31 having a size larger than size of each of other electrical connection pinholes 31 in the female connector 30, and the size of each of other electrical connection pinholes 31 includes the length L, the width W and the depth D. In the embodiment, the length and the depth of at least one of electrical connection pinholes 31 are greater than those of other electrical connection pinhole 31, but this example is merely for schematic illustration and the application field of the present disclosure is not limited thereto. For example, the length of at least one of electrical connection pinholes 31 is longer than that of other electrical connection pinhole 31, or the depth of at least one of electrical connection pinholes 31 is higher than that of other electrical connection pinhole 31, or the width of at least one of electrical connection pinholes 31 is wider than that of other electrical connection pinhole 31.

By designing at least one of the electrical connection pinholes 31 to have different size, when the male connector of another industrial input/output device is electrically connected to the female connector of the industrial input/output device, the electrical connection pins may respectively be in contact with the electrical connection pinholes in different timing, respectively; in other words, the electrical connection pinhole having the larger size may be in contact with the electrical connection pin corresponding thereto before the other electrical connection pins are in contact with the other electrical connection pinholes. As a result, the electrical connection pin and the electrical connection pinhole defined as ground can be in contact with each other earlier while the male connector of another industrial input/output device is being electrically connected to the female connector of the industrial input/output device; or, the electrical connection pin and electrical connection pinhole, which are predefined to conduct with each other earlier, are electrically connected to each other earlier while the male connector of another industrial input/output device is being electrically connected to the female connector of the industrial input/output device.

Figure 7A:
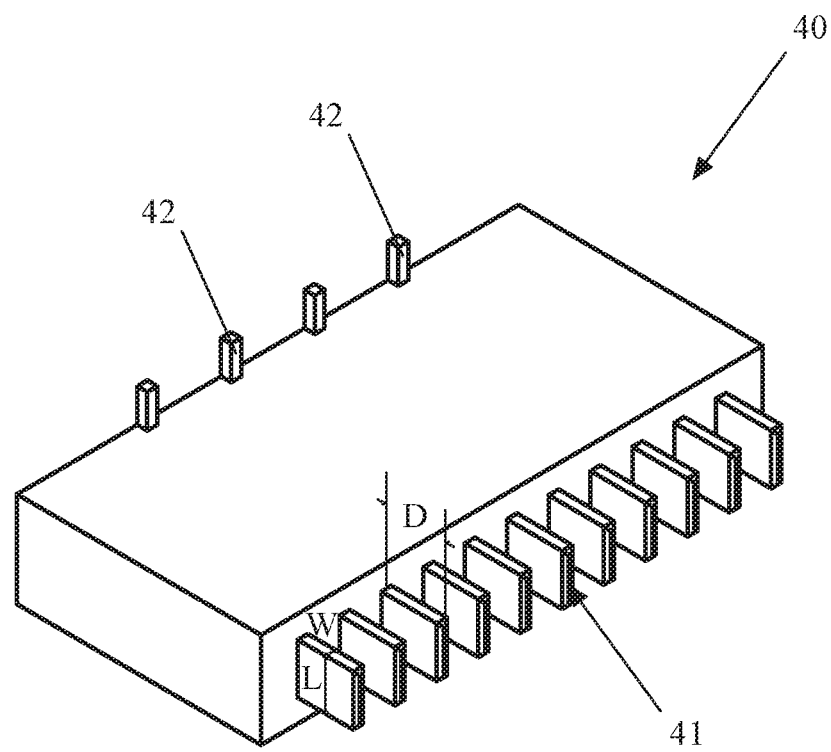
FIG. 7A is a perspective view of a first embodiment of the male connector of the industrial input/output device with series connectors in accordance with the present disclosure.
Figure 7B:
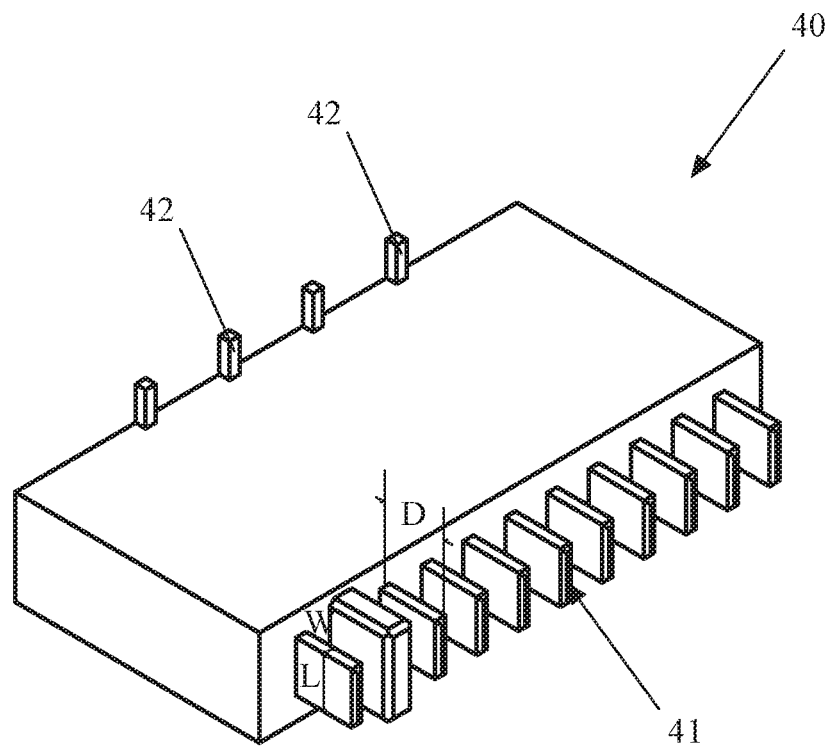
FIG. 7B is a perspective view of a second embodiment of the male connector of the industrial input/output device with series connectors in accordance with the present disclosure.

Please refer to FIGS. 7A and 7B, which show perspective views of first and second embodiments of the male connector of the industrial input/output device with series connectors in accordance with the present disclosure, respectively.

As shown in FIG. 7A, each of the electrical connection pins 41 of the male connector 40 has the same size including the length L, the width W and the depth D.

As shown in FIG. 7B, in the second embodiment, the male connector 40 has an electrical connection pin 41 having a size larger than that of other electrical connection pin 41. The size of the other electrical connection pin 41 includes the length L, the width W and the depth D.

By designing at least one of the electrical connection pins 41 to have a different size, when the male connector of another industrial input/output device is being electrically connected to the female connector of the industrial input/output device, the electrical connection pins may respectively be in contact with the electrical connection pinholes in different timing; in other words, the electrical connection pin having the larger size may be in contact with the electrical connection pinhole corresponding thereto before the other electrical connection pins are in contact with the other electrical connection pinholes. As a result, the electrical connection pin and the electrical connection pinhole, both defined as ground, are in contact with each other first while the male connector of another industrial input/output device is being electrically connected to the female connector of the industrial input/output device; or, the electrical connection pin and electrical connection pinhole, which are predefined to conduct with each other more easily, are electrically connected to each other earlier while the male connector of another industrial input/output device is being electrically connected to the female connector of the industrial input/output device.

It should be noted that the male connector 40 shown in FIGS. 7A or 7B is disposed on the second surface 22 (shown in FIG. 2B) of the circuit board 20 by surface mounting pins 42 thereof through surface mount technology (SMT), so that it can reduce the occupied space, but this example is merely for schematic illustration and the application field of the present disclosure is not limited thereto. In an embodiment, the male connector 40 can be disposed on the second surface 22 of the circuit board 20 by a direct solder manner. Alternatively, the surface mounting pins 42 of the male connector 40 can be disposed on left and right ends of the male connector 40, or disposed on the upper and lower sides and the left and right ends of the male connector 40.

The height of the male connector 40 shown in FIGS. 7A and 7B is higher than the height of the electrical connection pin 41, but it is merely for exemplary illustration and the application field of the present disclosure is not limited thereto. The height of the male connector 40 can be equal to the height of the electrical connection pin 41, or the height and the width of the male connector 40 are designed in a certain ratio.

Figure 8A:
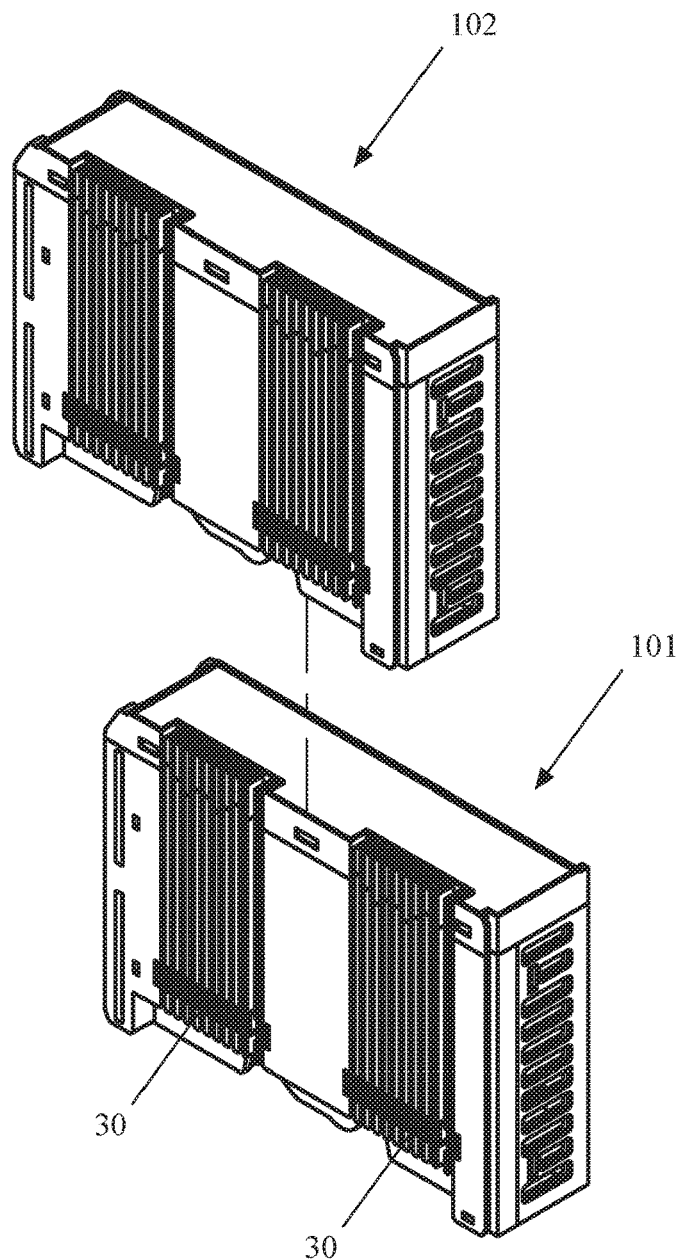
FIG. 8A is a perspective view of assembly of two industrial input/output devices with series connectors in accordance with the present disclosure, when viewed from a first angle.
Figure 8B:
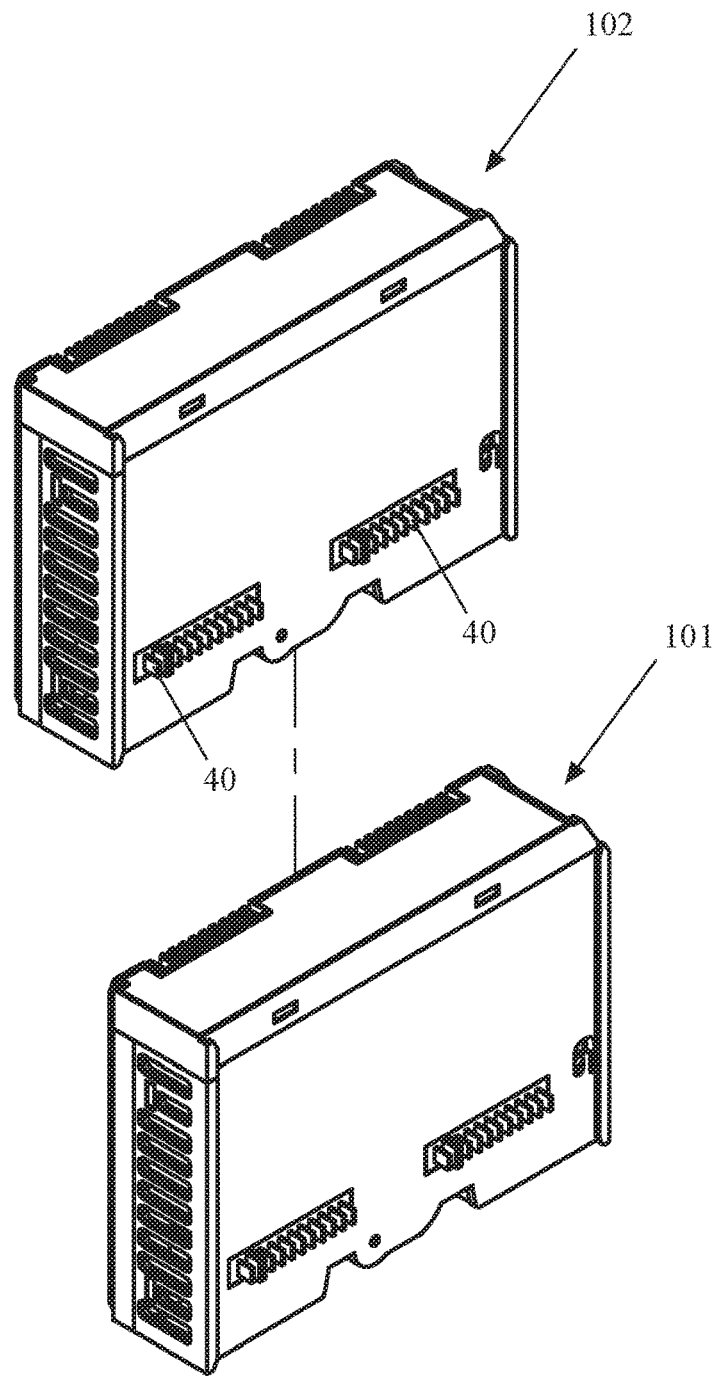
FIG. 8B is a perspective view of assembly of the two industrial input/output devices with series connectors in accordance with the present disclosure, when viewed from a second angle.

Please refer to FIGS. 8A and 8B, which are perspective views of assembly of the two industrial input/output devices of the present disclosure, when viewed from a first angle and a second angle respectively.

The first industrial input/output device 101 (that is, one industrial input/output device) and the second industrial input/output device 102 (that is, another industrial input/output device) are slid longitudinally to assemble with each other, so as to electrically connect the male connector 40 of the second industrial input/output device 102 with the female connector 30 of the first industrial input/output device 101.

Figure 9A:
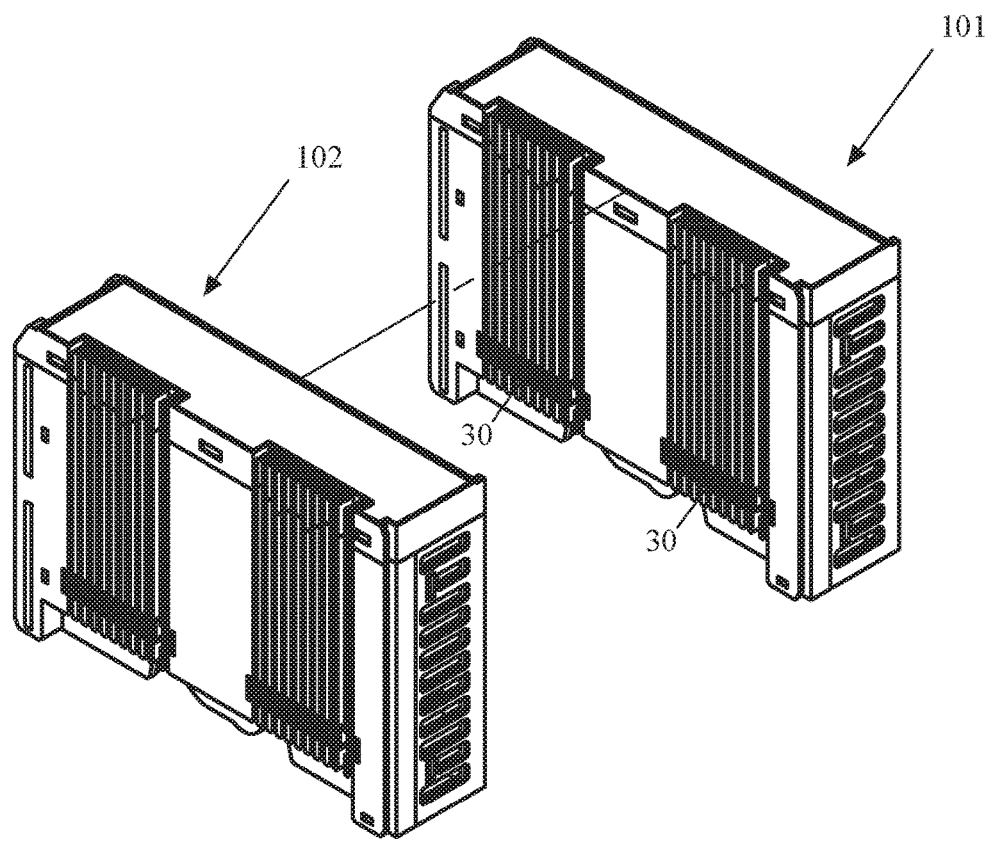
FIG. 9A is a perspective view of assembly of two industrial input/output devices with series connectors in accordance with the present disclosure, when viewed from a first angle.
Figure 9B:
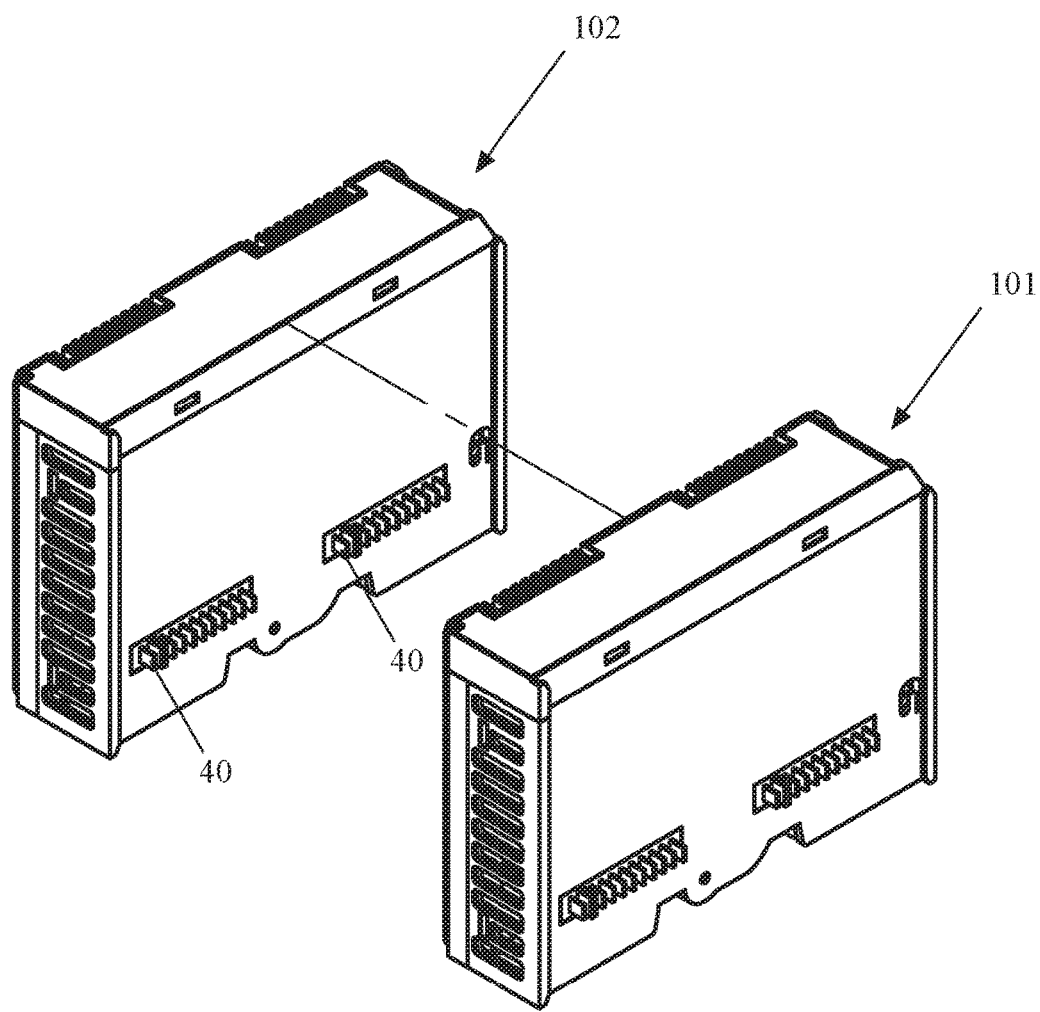
FIG. 9B is a perspective view of assembly of the two industrial input/output devices with series connectors in accordance with the present disclosure, when viewed from a second angle.

Please refer to FIGS. 9A and 9B, which are perspective views of assembly of the two industrial input/output devices of the present disclosure, when viewed from first and second angles respectively.

The first industrial input/output device 101 and the second industrial input/output device 102 are horizontally moved to assemble with each other, so as to electrically connect the male connector 40 of the second industrial input/output device 102 with the female connector 30 of the first industrial input/output device 101.

Figure 10A:
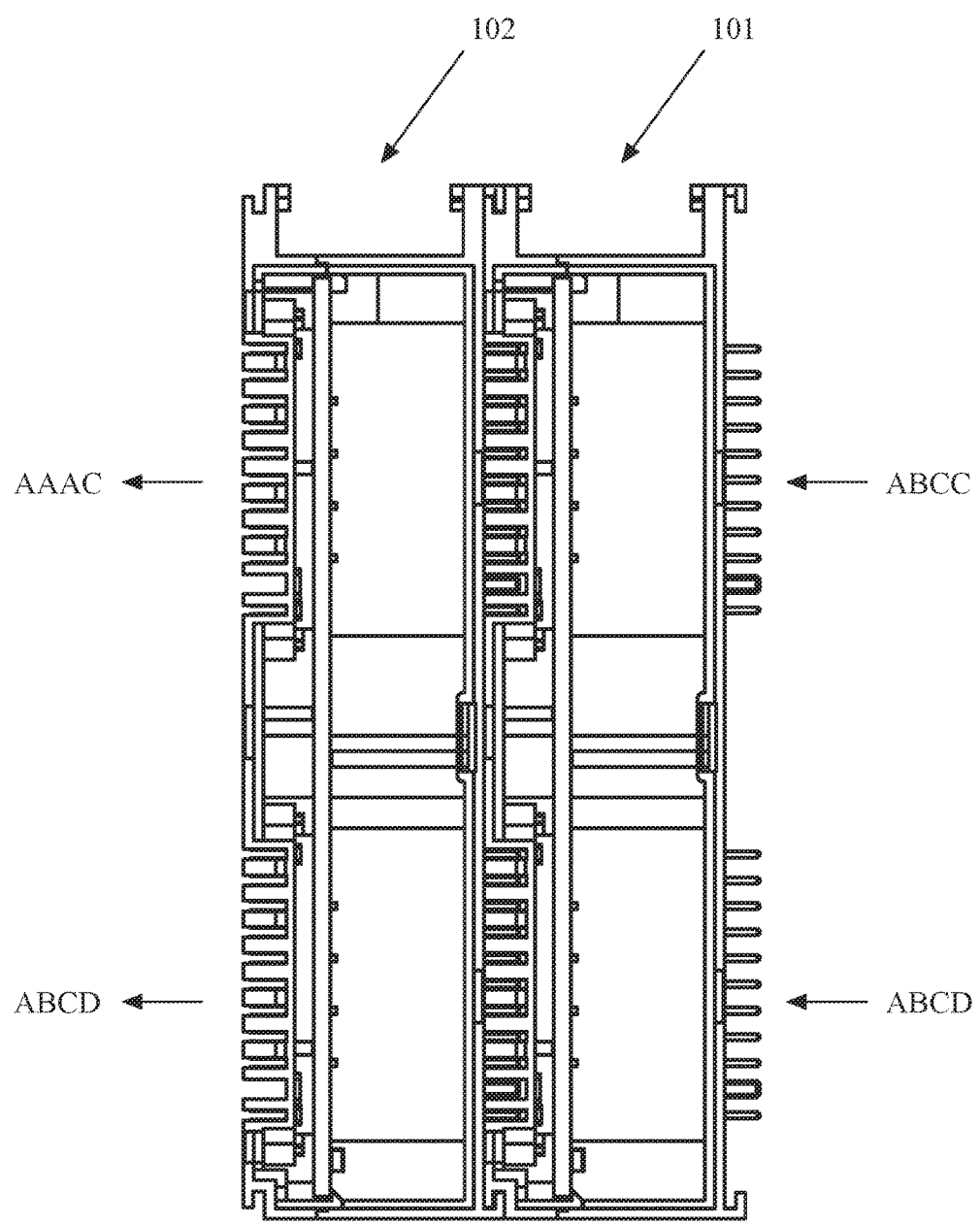
FIG. 10A and FIG. 10B are plan views showing signal transmission flow of the two industrial input/output devices with series connectors in accordance with the present disclosure.
Figure 10B:
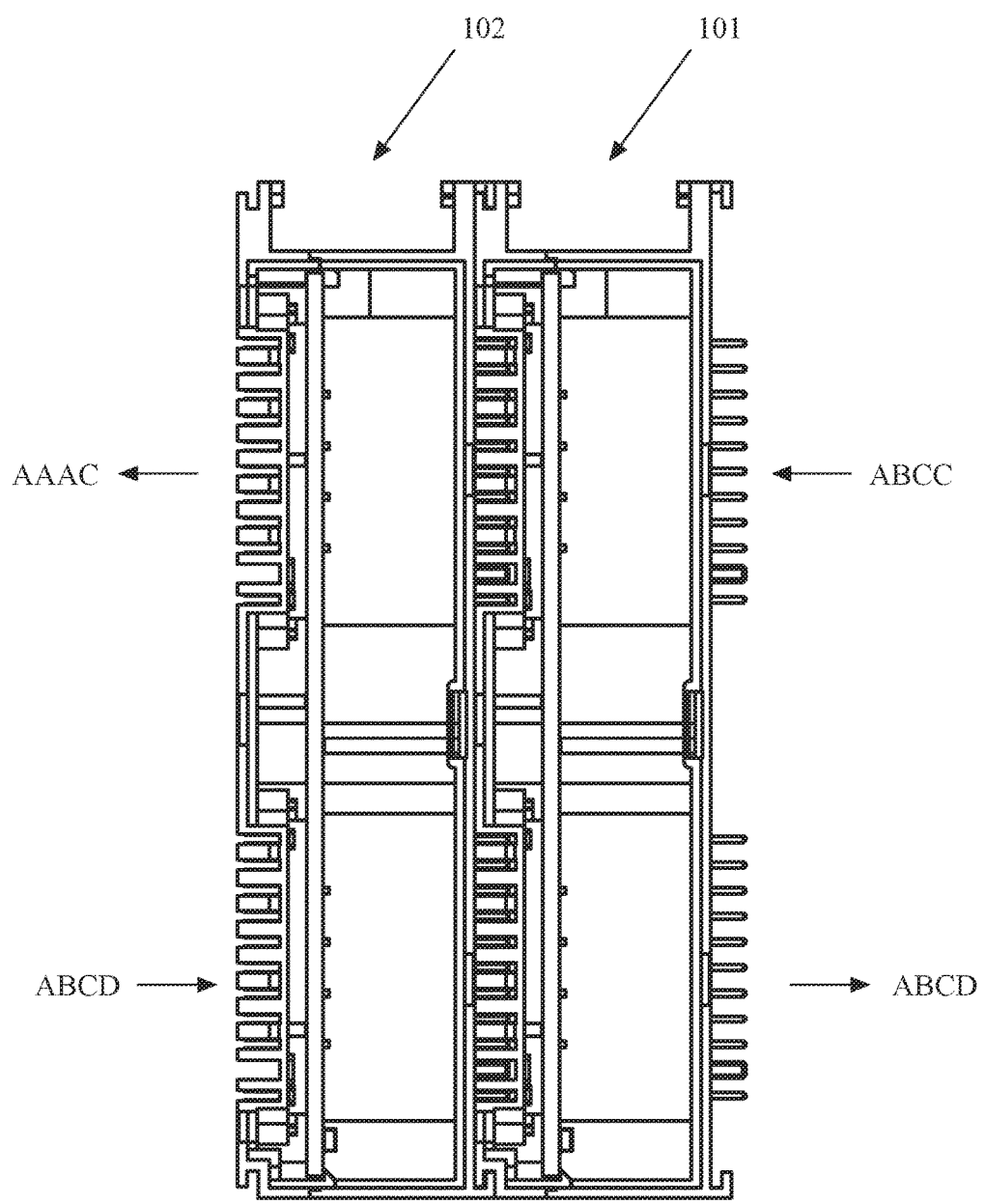

Please refer to FIGS. 10A and 10B, which are plan views showing signal transmission flow of the two industrial input/output devices with series connectors in accordance with the present disclosure.

As shown in FIG. 10A, after the male connector 40 of the second industrial input/output device 102 is electrically connected to the female connector 30 of the first industrial input/output device 101, signal transmission between the male connector 40 of the second industrial input/output device 102 and the female connector 30 of the first industrial input/output device 101 is uni-directional, that is, the signal is transmitted from the male connector 40 of the second industrial input/output device 102 to the female connector 30 of the first industrial input/output device 101, or from the female connector 30 of the first industrial input/output device 101 to the male connector 40 of the second industrial input/output device 102.

As shown in FIG. 10B, after the male connector 40 of the second industrial input/output device 102 is electrically connected to the female connector 30 of the first industrial input/output device 101, signal transmission between the male connector 40 of the second industrial input/output device 102 and the female connector 30 of the first industrial input/output device 101 is bi-directional; in other words, the signal can be transmitted from the male connector 40 of the second industrial input/output device 102 to the female connector 30 of the first industrial input/output device 101 and from the female connector 30 of the first industrial input/output device 101 to the male connector 40 of the second industrial input/output device 102.

Figure 11:
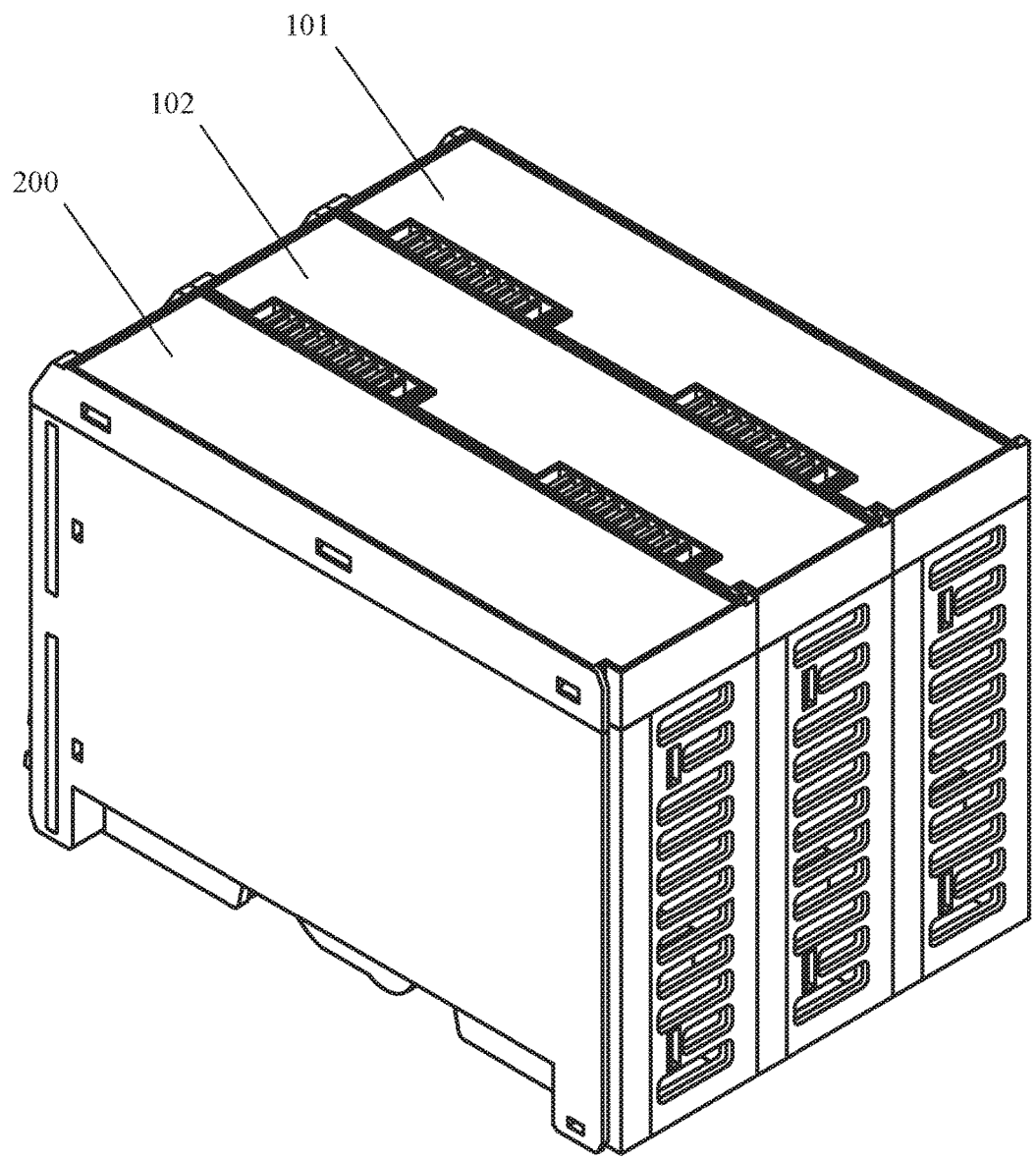
FIG. 11 is a perspective view of assembly of a control device and the input/output device of an industrial input/output device with series connectors in accordance with the present disclosure.

Please refer to FIG. 11, which is a perspective view of assembly of a control device and an industrial input/output device of the present disclosure.

The control device 200 can be in electrical connection with the industrial input/output device (such as the industrial input/output device 102 shown in FIG. 11) through above-mentioned male connector or the female connector, and the industrial input/output devices (such as the industrial input/output devices 101 and 102 shown in FIG. 11) are in electrical connection with each other through the male connector or the female connector, so that the industrial input/output devices 101 and 102 can receive power from the control device 200 and be controlled by the control device 200.

Figure 12:
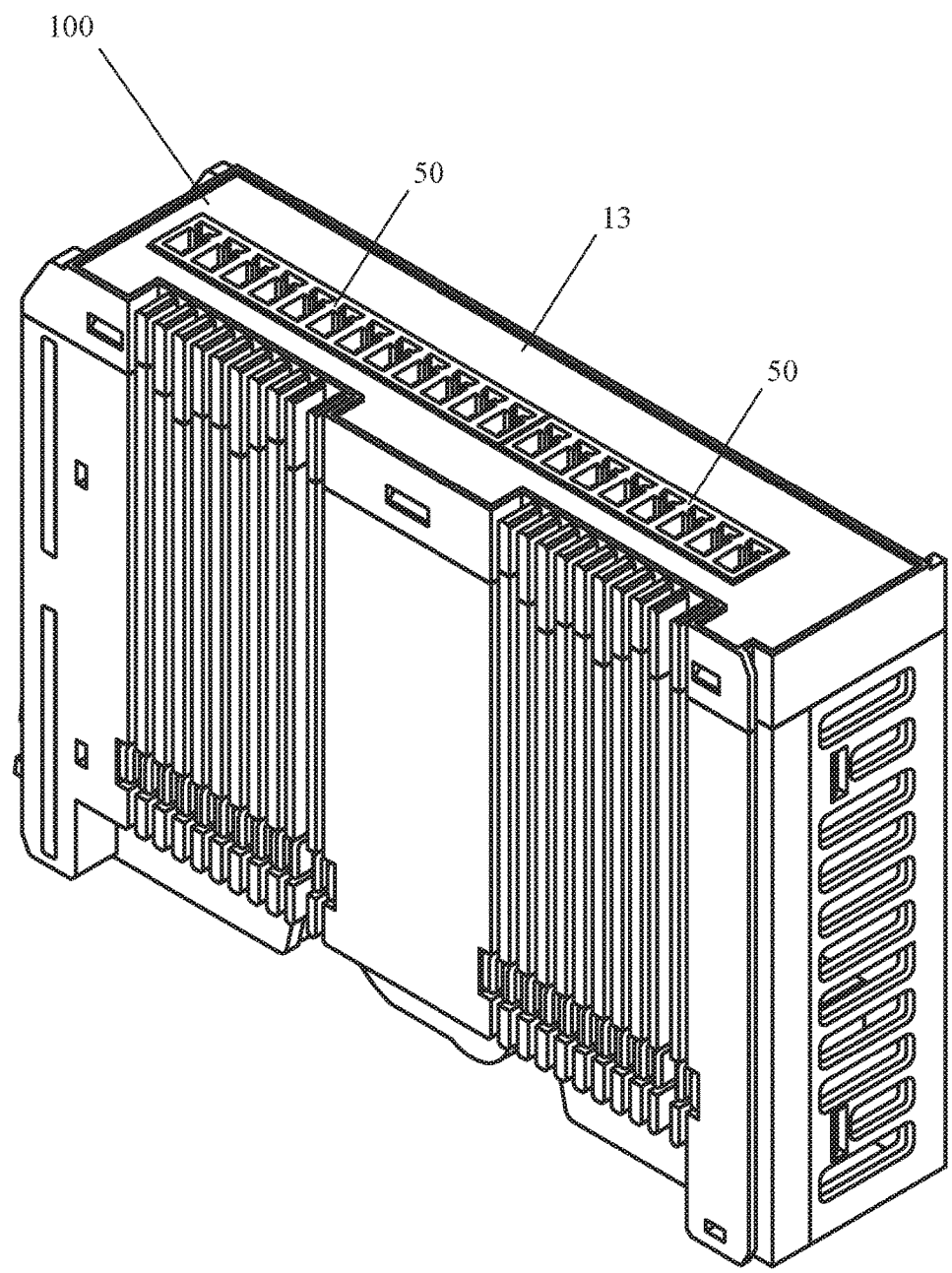
FIG. 12 is a perspective view of an expansion interface of the input/output device of the industrial input/output device with series connectors in accordance with the present disclosure.

Please refer to FIG. 12, which is a perspective view of an expansion interface of the input/output device of the industrial input/output device of the present disclosure.

The expansion interface 13 of the industrial input/output device 100 includes at least one expansion interface 50 which is configured to electrically connect an external device with the industrial input/output device 100. Preferably, the expansion interface 50 can be RJ45, DB9, M12, USB, or a combination thereof; however, these examples are merely for exemplary illustration, and the application field of the present disclosure is not limited thereto. In FIG. 12, the expansion interface 13 of the industrial input/output device 100 includes two expansion interfaces 50, but the application field of the present disclosure is not limited thereto.

To summarize, the difference between the present disclosure and the conventional technology is that the industrial input/output device of the present disclosure includes the circuit board, the pin guides, and the male connector and the female connector electrically connected to two sides of the circuit board respectively, so that the electrical connection pins of the male connector of another industrial input/output device can be guided to slide along the pin guides, to electrically connect to the female connector of the industrial input/output device.

By using above-mentioned technology, the conventional technology problem that it lacks the electrical connection timing control when the industrial input/output devices are being connected in series, and the industrial input/output device of the present disclosure can provide particular electrical connection timing control while the male connector and the female connector are being electrically connected.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. An industrial input/output device, in series with another industrial input/output device, the industrial input/output device comprising:
   a shell member;
   a circuit board disposed in the shell member;
   at least one female connector electrically connected to a first surface of the circuit board and exposed out of a first side surface of the shell member, and comprising a plurality of electrical connection pinholes;
   at least one male connector electrically connected to a second surface of the circuit board by surface mounting pins thereof through surface mount technology, and disposed corresponding in position to the at least one female connector, and exposed out of a second side surface of the shell member, and comprising a plurality of electrical connection pins;
   wherein the shell member comprises pin guides formed on the first side surface and corresponding in position to the electrical connection pinholes of the at least one female connector respectively, and configured to guide electrical connection pins of the at least one male connector of the another industrial input/output device to slide there along, thereby electrically connecting the at least one male connector of the another industrial input/output device with the at least one female connector of the industrial input/output device, wherein the electrical connection pins of the at least one male connector of the another industrial input/output device are in contact with the electrical connection pinholes of the at least one female connector of the industrial input/output device in different timing respectively since a length in a sliding direction, which the another industrial input/output device slides in, of at least one of electrical connection pinholes is longer than that of each of other electrical connection pinholes, the at least one female connector of the industrial input/output device is in electrical connection with the at least one male connector of the industrial input/output device through the circuit board;

wherein an input signal passing through the industrial input/output devices, which are connected in series, can be changed to be an output signal, and the input signal and the output signal are different from each other.

2. The industrial input/output device of according to claim 1, wherein the electrical connection pinholes are uniformly distributed in the female connector.

3. The industrial input/output device of according to claim 1, wherein the electrical connection pinholes are separately distributed on at least two pinhole areas of the female connector.

4. The industrial input/output device of according to claim 3, further comprising an anti-misplug structure formed between the at least two pinhole areas.

5. The industrial input/output device of according to claim 1, wherein the electrical connection pins are uniformly distributed in the male connector.

6. The industrial input/output device of according to claim 1, wherein the electrical connection pins are separately distributed on at least two pin areas of the male connector.

7. The industrial input/output device of according to claim 6, further comprising an anti-misplug structure formed between the at least two pin areas.

8. The industrial input/output device of according to claim 1, wherein the electrical connection pinholes are separately distributed on at least two pinhole areas of the female connector, and the electrical connection pins are separately distributed on the at least two pin areas of the male connector, and the pinhole areas of the female connector correspond to the pin areas of the male connector, respectively.

9. The industrial input/output device of according to claim 1, wherein a size of each pin guide matches with a size of the respective electrical connection pinhole.

10. The industrial input/output device of according to claim 1, wherein each of the pin guides is disposed on the first side surface of the shell member.

11. The industrial input/output device of according to claim 4, wherein the shell member comprises an anti-misplug structure guide formed on the first side surface thereof and corresponding to the anti-misplug structure of the female connector.

12. The industrial input/output device of according to claim 11, wherein a size of the anti-misplug structure guide matches with a size of the anti-misplug structure.

13. The industrial input/output device of according to claim 1, wherein at least one of the electrical connection pins of the male connector has a size larger than the size of each of the other of the electrical connection pins of the male connector.

14. The industrial input/output device of according to claim 1, wherein the male connector of the another industrial input/output device is electrically connected to the female connector of the industrial input/output device, so that unidirectional signal transmission is performed between the male connector of the another industrial input/output device and the female connector of the industrial input/output device.

15. The industrial input/output device of according to claim 1, wherein the male connector of the another industrial input/output device is electrically connected to the female connector of the industrial input/output device, so that bidirectional signal transmission is performed between the male connector of the another industrial input/output device and the female connector of the industrial input/output device.

16. The industrial input/output device of according to claim 1, wherein the male connector of the another industrial input/output device is electrically connected to the female connector of the industrial input/output device, so that the another industrial input/output device receives power from and is controlled by a control device through the male connector thereof, and the industrial input/output device receives power from and is controlled by the control device through the female connector thereof.

* * * * *